(12) United States Patent
An et al.

(10) Patent No.: US 9,989,582 B2
(45) Date of Patent: Jun. 5, 2018

(54) DEVICE FOR MEASURING THRESHOLD VOLTAGE OF A TRANSISTOR BASED ON CONSTANT DRAIN VOLTAGE AND CONSTANT DRAIN SOURCE CURRENT

(71) Applicants: SK hynix Inc., Icheon (KR); INDUSTRY-ACADEMIC COOPERATION FOUNDATION, YONSEI UNIVERSITY, Seoul (KR)

(72) Inventors: Youngjae An, Suwon (KR); Jung-Hyun Park, Seoul (KR); Kiryong Kim, Yeongdong-gun (KR); Seong-Ook Jung, Seoul (KR); Hyucksang Yim, Seoul (KR)

(73) Assignees: SK HYNIX INC., Icheon (KR); INDUSTRY-ACADEMIC COOPERATION FOUNDATION YONSEI UNIVERSITY, Seoul (KR)

( * ) Notice: Subject to any disclaimer, the term of this patent is extended or adjusted under 35 U.S.C. 154(b) by 40 days.

(21) Appl. No.: 15/006,038

(22) Filed: Jan. 25, 2016

(65) Prior Publication Data
US 2017/0003338 A1    Jan. 5, 2017

(30) Foreign Application Priority Data
Jul. 2, 2015   (KR) .................. 10-2015-0094562

(51) Int. Cl.
*G01R 31/06*   (2006.01)
*G01R 31/26*   (2014.01)

(52) U.S. Cl.
CPC ......... *G01R 31/2621* (2013.01); *G01R 31/06* (2013.01)

(58) Field of Classification Search
CPC ........ G11C 2029/5006; G11C 11/5642; G11C 11/412; G11C 29/50; G11C 29/50004; G11C 5/14; G11C 2207/2227; G11C 29/025; G11C 29/70; G11C 7/08; H02J 7/025; H02J 7/0011; H02J 7/0029; H02J 7/045; H02J 7/1461; G01R 15/16; G01R 19/145; G01R 19/15; G01R 19/155; G01R 19/16576; G01R 19/22; G01R 19/0084;
(Continued)

(56) References Cited

U.S. PATENT DOCUMENTS 5,039,941 A * 8/1991 Castro ................ G01R 31/2621
324/762.09
5,142,496 A * 8/1992 Van Buskirk .... G11C 29/50004
365/104

(Continued)

OTHER PUBLICATIONS

K. Aoyama, "A Method for Extracting the Threshold Voltage of MOSFETs Based on Current Components", Simulation of Semiconductor Devices and Processes, Sep. 1995, pp. 118-121, vol. 6.
(Continued)

*Primary Examiner* — Vinh Nguyen

(57) ABSTRACT

A threshold voltage measuring device may include a metal-oxide-semiconductor (MOS) transistor, a drain voltage clamping circuit configured to control a drain voltage of the MOS transistor wherein the drain voltage having a substantially constant level, and a constant current supply circuit configured to cause a drain-source current to flow through the MOS transistor wherein the drain-source current having a substantially constant magnitude.

20 Claims, 10 Drawing Sheets

(58) Field of Classification Search
CPC ........ G01R 19/16519; G01R 19/16538; G01R 19/16557; G01R 19/16571; G01R 27/2605; G01R 31/26; G01R 31/2628; G01R 31/2884; G01R 31/31723; G01R 31/3185; G01R 17/02; G01R 1/30; G01R 31/2621; G01R 31/2853; G01R 31/3187; G01R 2017/307; G06F 11/1008; G06F 1/305; G06F 17/05; G06F 2217/14; H03K 17/08104; H03K 3/013; H03K 17/00; H03K 17/0412; H03K 17/042; H03K 17/0812; H03K 17/08122; H03K 17/08; H03K 17/063; H03K 17/08142; H01L 27/0266; G09G 2310/0289; G09G 2330/024; G09G 3/296; G09G 3/2965; H02P 29/0241; H02P 9/006; H03F 1/52
See application file for complete search history.

(56) References Cited

U.S. PATENT DOCUMENTS

| | | | | |
|---|---|---|---|---|
| 6,078,204 | A | * 6/2000 | Cooper | B60T 8/268 327/309 |
| 6,498,519 | B1 | * 12/2002 | Terada | G01R 19/16547 327/77 |
| 7,868,640 | B2 | 1/2011 | Agarwal et al. | |
| 8,779,796 | B2 | 7/2014 | Luo et al. | |

OTHER PUBLICATIONS

Yasuhiro Miyake et al., "Benefit of Direct Charge Measurement (DCM) on Interconnect Capacitance Measurement", 2009, pp. 211-215, IEEE.

Brian L. Ji et al., "Operational Amplifier Based Test Structure for Transistor Threshold Voltage Variation", 2008 IEEE Conference on Microelectronic Test Structures, Mar. 24-27, 2008, pp. 3-7, IEEE, Edinburgh, UK.

Shunichi Watabe et al., "Statistical Evaluation of Process Damage Using an Arrayed Test Pattern in a Large Number of MOSFETs" IEEE Transactions on Electron Devices, Jun. 2010, pp. 1310-1318, vol. 57, No. 6, IEEE.

James C. Chen, "An On-Chip, Interconnect Capacitance Characterization Method with Sub-Femto-Farad Resolution", IEEE Transactions on Semiconductor Manufacturing, May 1998, pp. 204-210, vol. 11, No. 2, IEEE.

Yao-Wen Chang et al., "A Novel Simple CBCM Method Free From Charge Injection-Induced Errors", IEEE Electron Device Letters, May 2004, pp. 262-264, vol. 25, No. 5, IEEE.

Peiyong Zhang et al., "Analysis and Characterization of Capacitance Variation Using Capacitance Measurement Array", IEEE Transactions on Semiconductor Manufacturing, May 2014, pp. 301-311, vol. 27, No. 2, IEEE.

* cited by examiner

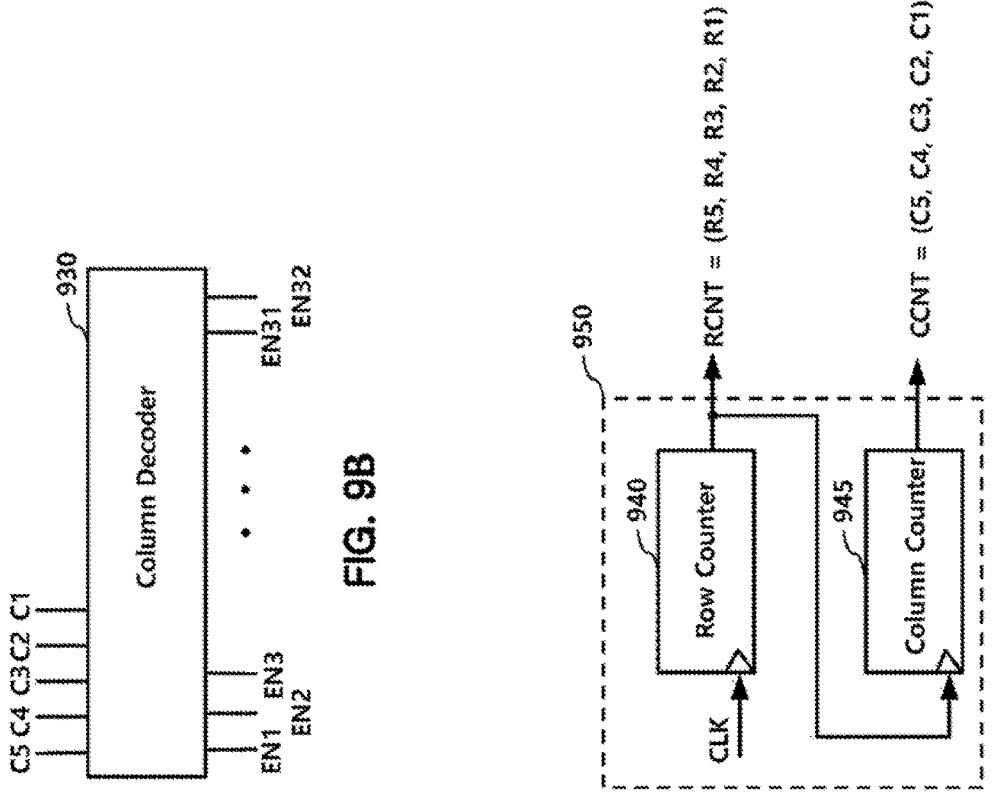
FIG. 9B
FIG. 9C
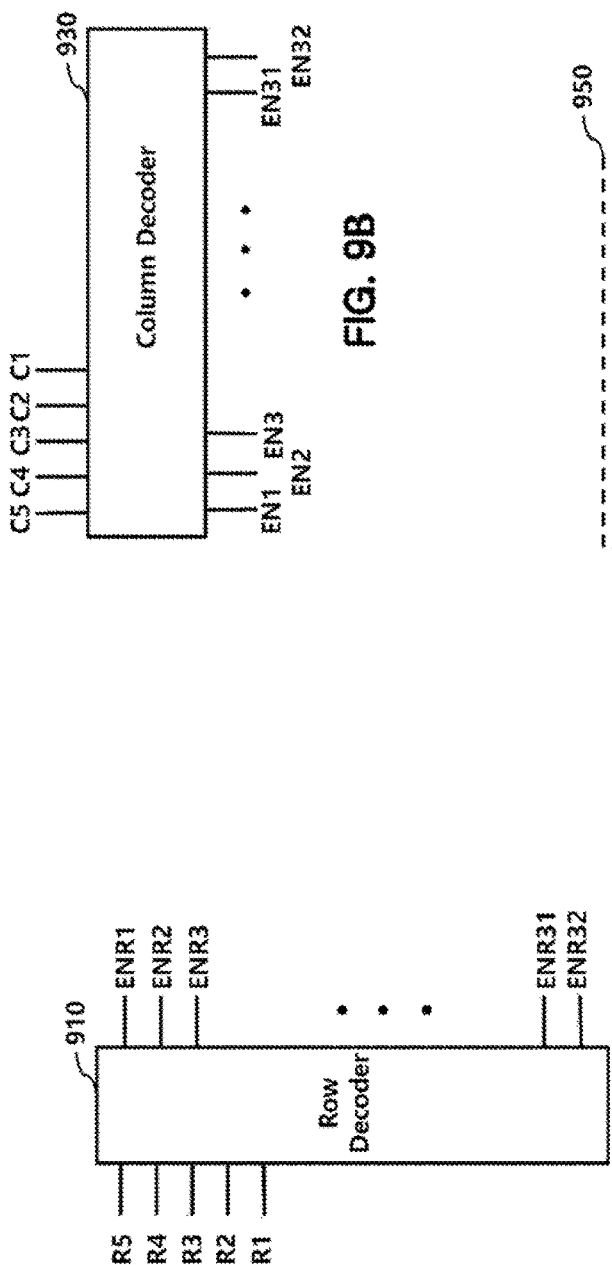
FIG. 9A

DEVICE FOR MEASURING THRESHOLD VOLTAGE OF A TRANSISTOR BASED ON CONSTANT DRAIN VOLTAGE AND CONSTANT DRAIN SOURCE CURRENT

CROSS-REFERENCE TO RELATED APPLICATION

The present application claims priority of Korean Patent Application No. 10-2015-0094562, filed on Jul. 2, 2015, which is incorporated herein by reference in its entirety.

BACKGROUND

1. Field

Embodiments of the present disclosure relate to a device for measuring a threshold voltage of a MOS transistor, and more particularly, to a threshold voltage measuring device capable of accurately measuring the threshold voltage by removing an error which occurs due to a body effect or the like.

2. Description of the Related Art

FIG. 1 is a circuit diagram illustrating a conventional threshold voltage measuring device for measuring a threshold voltage of an N-channel metal-oxide-semiconductor (NMOS) transistor N.

The conventional threshold voltage measuring device supplies a gate voltage VG of the NMOS transistor N that has a constant level. The conventional threshold voltage measuring device generates a drain-source current, which is substantially the same as a reference current IREF.

The drain-source current is provided using a current mirror that includes NMOS transistors N1 and N2.

A method for measuring a threshold voltage includes a constant current method. In the constant current method, a threshold voltage is defined as a gate-source voltage when a predefined pinch-off current ISPEC flows between the drain and source of a MOS transistor.

The pinch-off current ISPEC may be defined as a drain-source current of the MOS transistor when a pinch-off of a channel in the MOS transistor occurs. A magnitude of the pinch-off current ISPEC may be experimentally determined.

For example, for an illustrative fabrication technology, the pinch-off current ISPEC may be determined as expressed by Equation 1 below. In Equation 1, W represents a channel width of a MOS transistor, and L represents a channel length of the MOS transistor.

$$I_{SPEC} = \frac{W}{L} \times 10^{-7} (A) \qquad \text{[Equation 1]}$$

FIG. 2 is a graph illustrating a threshold voltage measurement method using the constant current method.

The graph of FIG. 2 shows a drain-source current IDS according to a gate-source voltage VGS and a drain-source voltage VDS.

A magnitude of the pinch-off current ISPEC shown in FIG. 2 may be experimentally determined, as expressed by Equation 1.

A first solid curve indicates the gate-source voltage VGS when a first drain-source voltage VDS1 is sufficiently large to cause the NMOS transistor N to operate in a saturation region. A second solid curve indicates the gate-source voltage VGS when a second drain-source voltage VDS2 is sufficiently small to cause the NMOS transistor N to operate in a linear region.

Referring back to FIG. 1, the drain-source current IREF is adjusted to have substantially the same magnitude as that of the pinch-of current ISPEC when the gate voltage VG is maintained constant, and a source voltage VS is measured. At this time, the gate-source voltage VGS corresponds to the threshold voltage of the NMOS transistor N.

However, when a potential difference occurs between a back gate of a MOS transistor and a source of the MOS transistor, a body effect may lead to a variation in the threshold voltage. Where $2\phi_B$ is a surface potential, $V_{BS}$ is a source-to-body substrate bias, and γ is a fabrication-process parameter, the variation of the threshold voltage $\Delta V_T$ due to the body effect may be expressed as Equation 2 below:

$$\Delta V_T = \gamma(\sqrt{2\phi_B + V_{BS}} - \sqrt{2\phi_B}). \qquad \text{[Equation 2]}$$

In the conventional threshold voltage measuring device, when the source voltage or the back gate voltage varies, the body effect may occur. In this case, the threshold voltage may vary. Thus, although the gate-source voltage VGS is measured when the pinch-off current ISPEC is applied as described above, the threshold voltage of the NMOS transistor N may not be accurately measured.

SUMMARY

Various embodiments are directed to a threshold voltage measuring device capable of accurately measuring a threshold voltage by substantially preventing an occurrence of a body effect.

Also, various embodiments are directed to a threshold voltage measuring device capable of accurately measuring a threshold voltage by causing a drain-source current that has a substantially constant magnitude to flow through a MOS transistor.

Also, various embodiments are directed to a threshold voltage measuring device capable of accurately measuring threshold voltages of a plurality of MOS transistors arranged in an array.

In an embodiment, a threshold voltage measuring device may include a metal-oxide-semiconductor (MOS) transistor, a drain voltage clamping circuit configured to control a drain voltage of the MOS transistor wherein the drain voltage having a substantially constant level, and a constant current supply circuit configured to cause a drain-source current to flow through the MOS transistor wherein the drain-source current having a substantially constant magnitude.

In an embodiment, a threshold voltage measuring device may include a transistor array comprising a plurality of MOS transistors arranged in a matrix wherein the matrix being defined by a plurality of rows and a plurality of columns, a row selector configured to apply a gate voltage to a selected row among the plurality of rows according to a row select signal, a column selector configured to select a column among the plurality of columns according to a column select signal, a bias controller configured to apply a bias voltage to unselected rows among the plurality of rows, a drain voltage clamping circuit configured to provide a drain voltage of a MOS transistor selected by the row select signal and the column select signal wherein the drain voltage having a substantially constant level, and a constant current supply circuit configured to cause a drain-source current to flow through the selected MOS transistor wherein the drain-source current having a substantially constant magnitude.

BRIEF DESCRIPTION OF THE DRAWINGS

FIGS. 9A to 9C are block diagrams of a row decoder, a column decoder, and a decoder controller, respectively, according to an embodiment.

DETAILED DESCRIPTION

Figure 1:
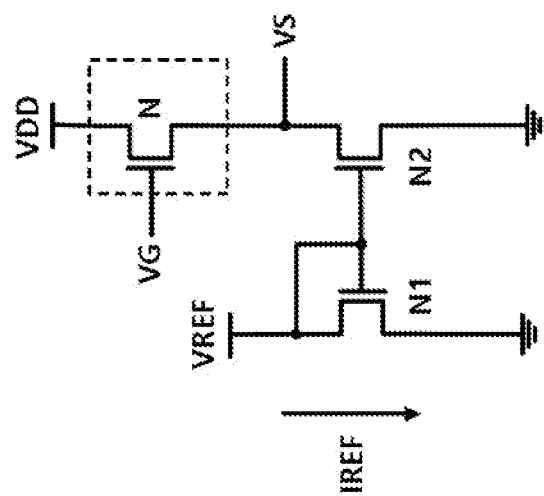
FIG. 1 is a circuit diagram illustrating a conventional threshold voltage measuring device.
Figure 2:
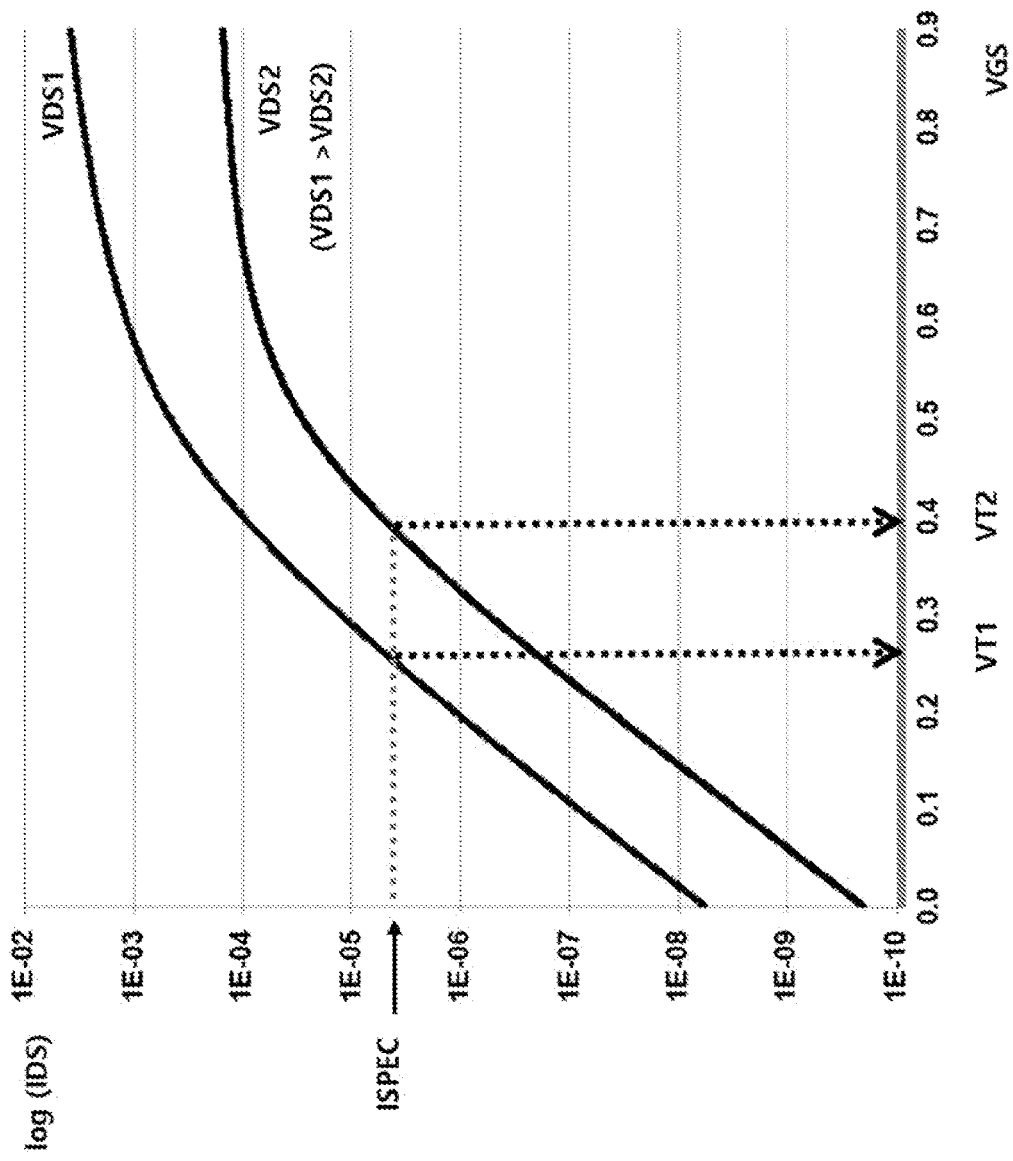
FIG. 2 is a graph illustrating a threshold voltage measurement method.

Various embodiments will be described below in more detail with reference to the accompanying drawings. The present disclosure should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

In embodiments of the present disclosure, a source voltage and a drain voltage of a MOS transistor are maintained at substantially constant levels, respectively, in contrast to the conventional threshold voltage measuring device in which a gate voltage is maintained at a substantially constant level. In these embodiments, the threshold voltage of the MOS transistor is measured by measuring a gate voltage when a drain-source current flowing through the MOS transistor is a pinch-off current ISPEC.

Figure 3:
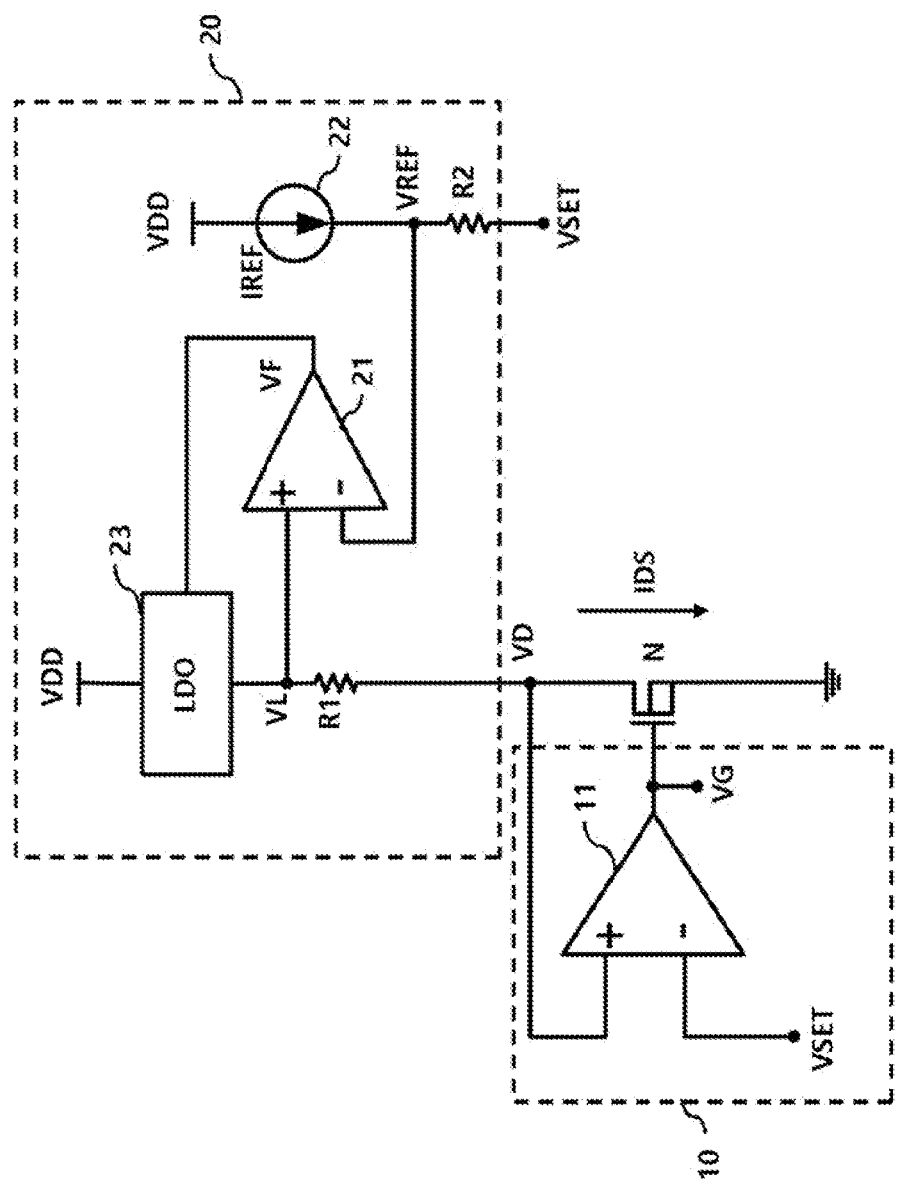
FIGS. 3 and 4 are circuit diagrams of a threshold voltage measuring device for a single transistor according to embodiments.
Figure 4:
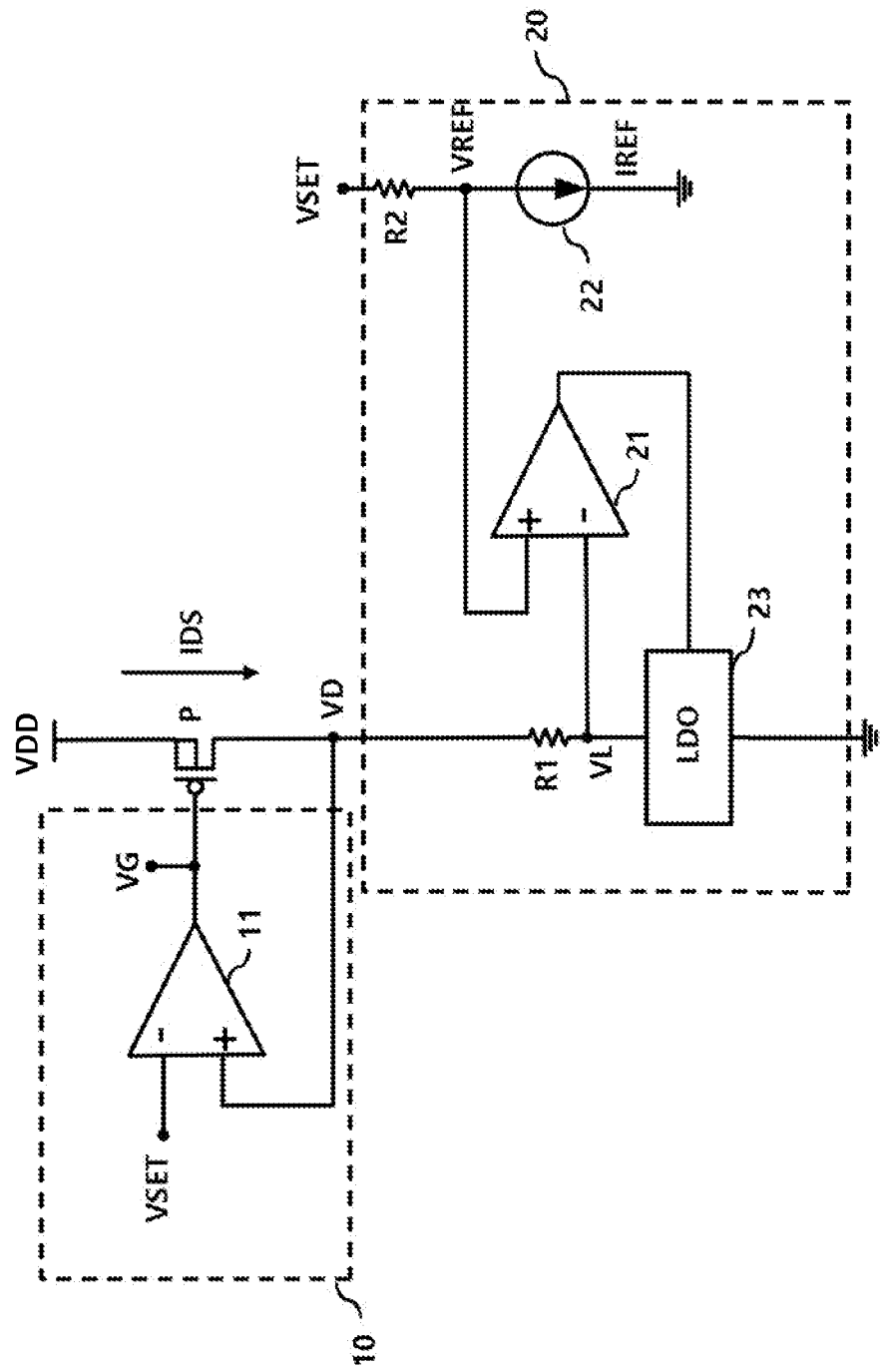

FIGS. 3 and 4 are circuit diagrams of a threshold voltage measuring device for a single transistor according to embodiments.

In the embodiment of FIG. 3, a threshold voltage of an NMOS transistor N is measured.

The threshold voltage measuring device in accordance with the embodiment of FIG. 3 includes a drain voltage clamping circuit 10 and a constant current supply circuit 20.

The drain voltage clamping circuit 10 includes a first operational amplifier 11. The first operational amplifier 11 generates a gate voltage VG by amplifying a difference between a set voltage VSET and a drain voltage VD.

Through a feedback operation of the first operational amplifier 11, the drain voltage VD of the NMOS transistor N becomes substantially equal to the set voltage VSET that has a constant level. In an embodiment, a level of the drain voltage VD is maintained substantially constant such that a fluctuation of the drain voltage VD is less than 5%, 3%, 1%, or 0.5% of the level of the set voltage VSET.

The constant current supply circuit 20 provides a current that causes a drain-source current IDS to flow through the NMOS transistor N. In an embodiment, the current provided by the constant current supply circuit 20 is substantially equal to the drain-source current IDS of the NMOS transistor N.

In the embodiment of FIG. 3, the constant current supply circuit 20 includes a second operational amplifier 21, a reference current source 22, a first resistor R1, a second resistor R2, and a linear regulator 23. Hereinafter, a current replication circuit may refer to the second operation amplifier 21, the first resistor R1, the second resistor R2, and the linear regulator 23.

The linear regulator 23 stably outputs a rectified voltage VL even when a supply voltage VDD varies. For the interest of brevity, the detailed descriptions for the configuration and operation of the linear regulator 23 are omitted herein. In an embodiment, the linear regulator 23 is a Low Drop-Out (LDO) linear regulator.

The second operational amplifier 21 amplifies a difference between the rectified voltage VL output from the linear regulator 23 and a reference voltage VREF of the reference current source 22, and outputs a feedback voltage VF for controlling the linear regulator 23. In the embodiment shown in FIG. 3, the linear regulator 23 is configured so that an increase of the value of the feedback voltage VF causes a decrease in the value of the rectified voltage VL.

Through a feedback control operation of the second operational amplifier 21, the rectified voltage VL becomes substantially equal to the reference voltage VREF output from the linear regulator 23. In an embodiment, a difference between a level of the rectified voltage VL and a level of the reference voltage VREF becomes less than 5%, 3%, 1%, or 0.5% of a level of the reference voltage VREF.

A current flowing through the first resistor R1, which is the current provided by the constant current supply circuit 20, is substantially equal to the drain-source current IDS of the NMOS transistor N, and thus a magnitude of the drain-source current IDS is expressed as Equation 3 below.

$$I_{DS} = \frac{V_L - V_D}{R_1} \qquad \text{[Equation 3]}$$

Since the rectified voltage VL output from the linear regulator 23 is substantially equal to the reference voltage VREF and the reference voltage VREF is expressed as Equation 4 below, the drain-source current IDS may be expressed as Equation 5 below:

$$V_L = V_{REF} = V_{SET} + I_{REF} R_2, \text{ and} \qquad \text{[Equation 4]}$$

$$I_{DS} = \frac{V_{SET} + I_{REF} R_2 - V_D}{R_1} = I_{REF} \frac{R_2}{R_1}. \qquad \text{[Equation 5]}$$

In an embodiment, resistance values of the first and second resistors R1 and R2 are substantially the same, and thus the drain-source current IDS of the NMOS transistor N becomes substantially equal to a reference current IREF provided by the reference current source 22. In an embodiment, the magnitude of the drain-source current IDS is substantially equal to that of the reference current IREF such that a difference between the magnitudes of the drain-source current IDS and the reference current IREF is less than 3%, 1%, or 0.5% of the magnitude of the reference current IREF.

In an embodiment, a magnitude of the reference current IREF is maintained substantially constant. such that a fluctuation of the reference current IREF is less than 5%, 3%, 1% or 0.1% of an average magnitude of the reference current IREF. In an embodiment, a magnitude of the drain-source current IDS is maintained substantially constant such that a fluctuation of the drain-source current IDS is less than 5%, 3%, 1%, or 0.1% of an average magnitude of the drain-source current IDS.

In FIG. 3, a back gate voltage and a source voltage of the NMOS transistor N are set to substantially the same voltage (for example, a ground voltage). Because the back gate-source voltage becomes substantially zero, a threshold voltage variation caused by a body effect may not occur. In an embodiment, the back gate voltage corresponds to a voltage applied to a portion of a substrate other than source and drain regions of the substrate. In the embodiment of FIG. 3, the reference current IREF of the reference current source 22 may be adjusted to be substantially equal to a pinch-off current of the NMOS transistor N, and then the gate voltage VG may be measured, in order to measure the threshold voltage of the NMOS transistor N.

FIG. 4 illustrates an embodiment for measuring the threshold voltage of a P-channel metal-oxide-semiconductor (PMOS) transistor P, and the embodiment of FIG. 4 has a similar configuration to that of the embodiment of FIG. 3.

The drain voltage clamping circuit 10 includes a first operational amplifier 11. The first operational amplifier 11 generates a gate voltage VG by amplifying a difference between a set voltage VSET and a drain voltage VD.

Through a feedback operation of the first operational amplifier 11, the drain voltage VD of the PMOS transistor P becomes substantially equal to the set voltage VSET.

The constant current supply circuit 20 provides a current that causes a drain-source current IDS to flow through the PMOS transistor P. In an embodiment, the current provided by the constant current supply circuit 20 is substantially equal to the drain-source current IDS of the PMOS transistor P.

In the embodiment of FIG. 4, the constant current supply circuit 20 includes a second operational amplifier 21, a reference current source 22, a first resistor R1, a second resistor R2, and a linear regulator 23.

In an embodiment, resistance values of the first and second resistors R1 and R2 are substantially the same, and thus the drain-source current IDS of the PMOS transistor P becomes substantially equal to a reference current IREF provided by the reference current source 22.

In the embodiment of FIG. 4, a back gate voltage and a source voltage of the PMOS transistor P are commonly connected to a supply voltage VDD. Because a difference between the back gate voltage and the source voltage becomes zero, a threshold voltage variation caused by a body effect may not occur.

In the embodiment of FIG. 4, the reference current IREF of the reference current source 22 may be adjusted to be substantially equal to a pinch-off current ISPEC of the PMOS transistor, and then the gate voltage VG may be measured, in order to calculate the threshold voltage of the PMOS transistor P.

Figure 5:
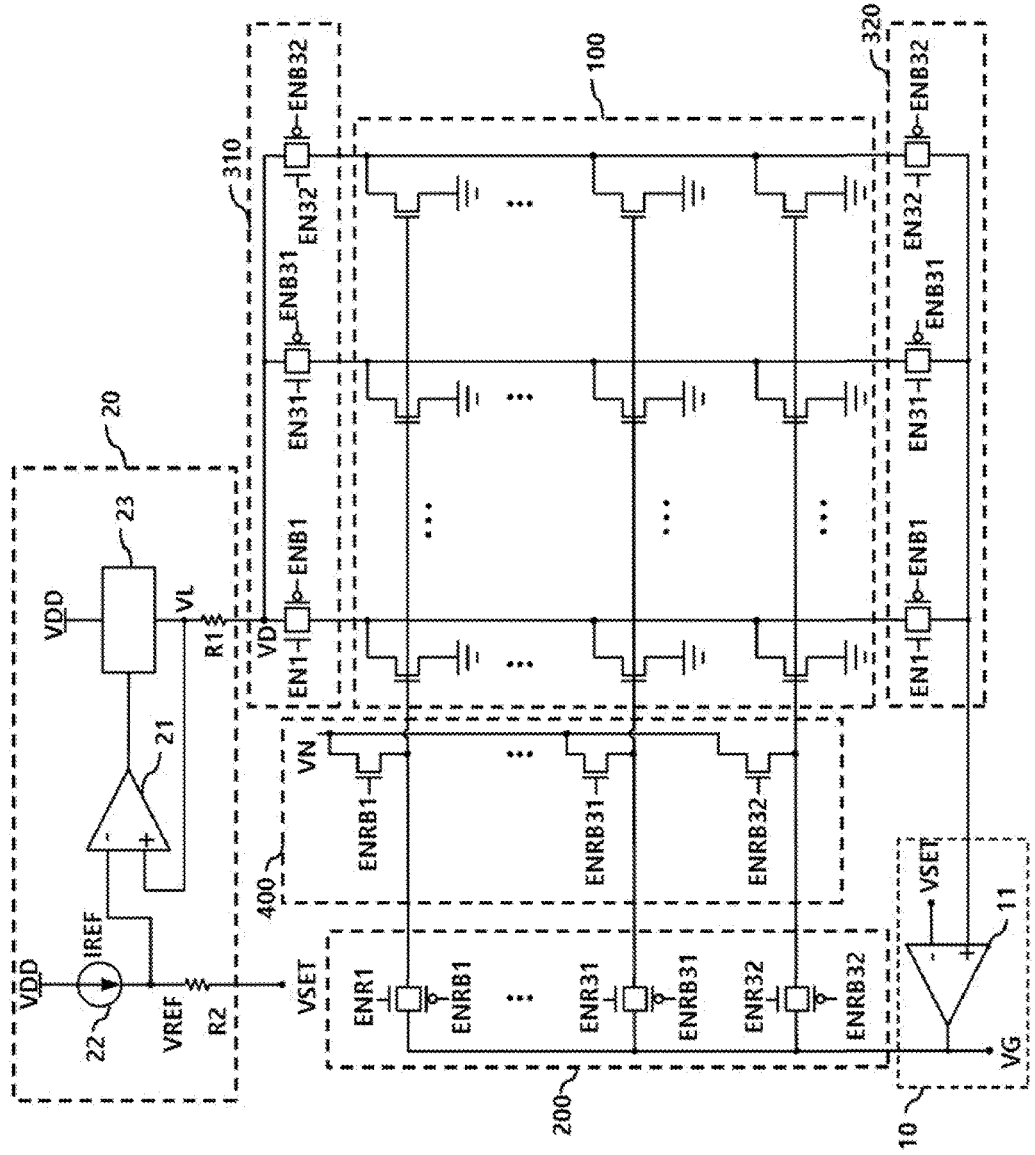
FIGS. 5 and 6 are circuit diagrams of a threshold voltage measuring device for a transistor array according to embodiments.
Figure 6:
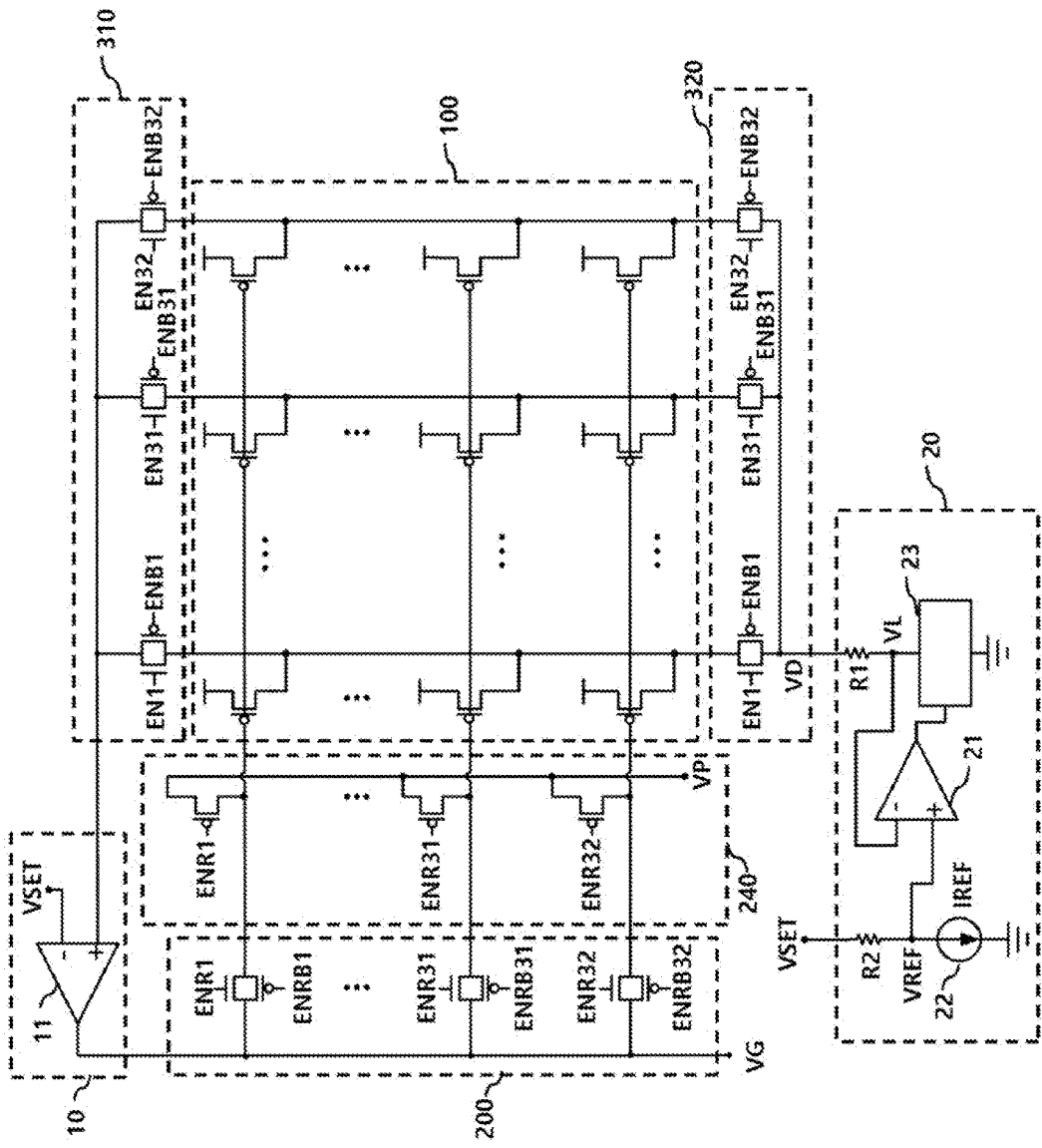

FIGS. 5 and 6 are circuit diagrams of a threshold voltage measuring device for a transistor array 100 according to embodiments.

FIG. 5 illustrates a threshold voltage measuring device for an NMOS transistor array 100 according to an embodiment, and FIG. 6 illustrates a threshold voltage measuring device for a PMOS transistor array 100 according to an embodiment. The embodiments of FIGS. 5 and 6 have substantially the same configuration except for the types of MOS transistors included in corresponding transistor arrays 100.

The threshold voltage measuring device of FIG. 5 includes an NMOS transistor array 100, a row selector 200, first and second column selectors 310 and 320, a bias controller 400, a drain voltage clamping circuit 10, and a constant current supply circuit 20.

The NMOS transistor array 100 includes a plurality of NMOS transistors arranged in a grid type. FIG. 5 illustrates an embodiment in which NMOS transistors are arranged in a 32×32 matrix. Sources and back gates of the NMOS transistors are maintained at substantially the same voltage (for example, a ground voltage).

The row selector 200 selects one of 32 rows according to row select signals ENRi and ENRBi ($1 \leq i \leq 32$, wherein each of the row select signals ENRBi has a value opposite the value of the corresponding row select signal ENRi.), and applies a gate voltage VG output from a first operational amplifier 11 of the drain voltage clamping circuit 10 to gates of NMOS transistors included in the selected row.

The first and second column selectors 310 and 320 select one of 32 columns according to column select signals ENj and ENBj ($1 \leq j \leq 32$, wherein each of the column select signals ENBi has a value opposite the value of the corresponding column select signal ENi.), and supplies a drain voltage VD to NMOS transistors included in the selected column. The drain voltage VD is substantially equal to a set voltage VSET.

The constant current supply circuit 20 provides a current that causes a drain-source current to flow through a single NMOS transistor selected by the row selector 200 and the column selectors 310 and 320. In an embodiment, the provided current is substantially equal to the drain-source current through the selected NMOS transistor.

The bias controller 400 applies a bias voltage VN to gates of NMOS transistors connected to the remaining rows that are not selected by the row selector 200. In an embodiment, the bias voltage VN prevents the current provided by the constant current supply circuit 20 from leaking through one or more of the NMOS transistors connected to the unselected rows. This embodiment will be described below with reference to FIG. 7 in more detail.

A process of measuring threshold voltages of respective NMOS transistors through the drain voltage clamping circuit 10 and the constant current supply circuit 20 is the same as that described with reference to FIG. 3. Thus, the detailed descriptions thereof are omitted herein in the interest of brevity.

The threshold voltage measuring device of FIG. 6 includes a PMOS transistor array 100, a row selector 200, first and second column selectors 310 and 320, a bias controller 240, a drain voltage clamping circuit 10, and a constant current supply circuit 20.

The PMOS transistor array 100 includes a plurality of PMOS transistors arranged in a grid type. FIG. 6 illustrates an example in which PMOS transistors are arranged in a 32×32 matrix. Sources and back gates of the PMOS transistors are maintained at substantially the same voltage (for example, a supply voltage).

The row selector 200 selects one of 32 rows according to row select signals ENRi and ENRBi ($1 \leq i \leq 32$), and applies a gate voltage VG output from a first operational amplifier 11 of the drain voltage clamping circuit 10 to gates of PMOS transistors included in the selected row.

The first and second column selectors 310 and 320 select one of 32 columns according to column select signals ENj and ENBj (1≤j≤32), and supplies a drain voltage VD to PMOS transistors included in the selected column. The drain voltage VD is substantially equal to a set voltage VSET.

The constant current supply circuit 20 provides a current that causes a drain-source current through a single PMOS transistor selected by the row selector 200 and the column selectors 310 and 320. In an embodiment, the provided current is substantially equal to the drain-source current through the selected PMOS transistor.

The bias controller 240 applies a bias voltage VP to gates of PMOS transistors included in the selected column and connected to the remaining rows that are not selected by the row selector 200.

In an embodiment, the bias voltage VP prevents the provided current by the constant current supply circuit 20 from leaking through one or more of the PMOS transistors connected to the unselected rows. This embodiment will be described below in more detail.

A process of measuring threshold voltages of respective PMOS transistors through the drain voltage clamping circuit 10 and the constant current supply circuit 20 is the same as that described with reference to FIG. 4. Thus, the detailed descriptions thereof are omitted herein for the interest of brevity.

Figure 7:
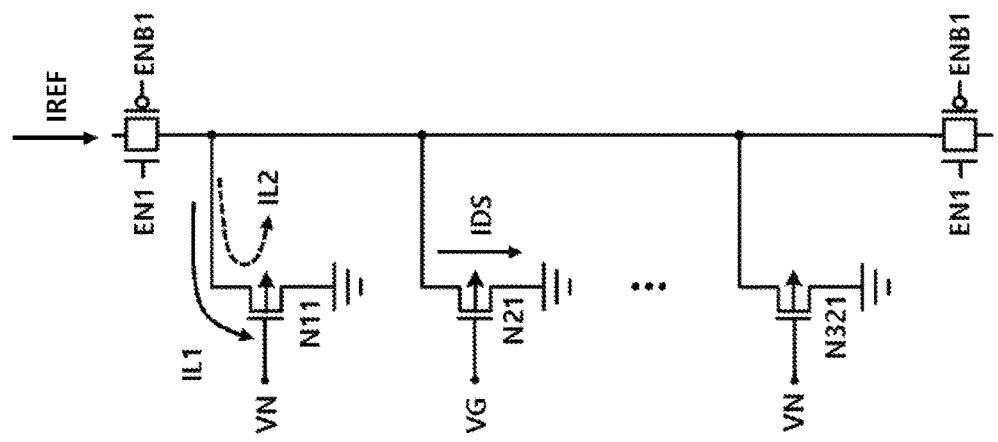
FIG. 7 is a circuit diagram illustrating an operation of the bias controller of FIG. 5 according to an embodiment.

FIG. 7 illustrates an operation of the bias controller 400 of FIG. 5 according to an embodiment.

In FIG. 7, the row selector 200 of FIG. 5 selects the second row and the column selectors 310 and 320 of FIG. 5 select the first column.

Thus, an output voltage of the first operational amplifier 11 of FIG. 5 is applied as a gate voltage VG of the second NMOS transistor N21 included in the first column, and the bias voltage VN provided from the bias controller 400 of FIG. 5 is applied to gates of the remaining NMOS transistors N11 and N31 to N321.

In the embodiment of FIG. 7, the bias voltage VN is a negative voltage. Thus, a first leakage current IL1 flowing through the first NMOS transistor N11 is blocked. However, when the bias voltage VN is a negative voltage that has an absolute level greater than a threshold level, a second leakage current IL2 may increase due to an occurrence of Gate Induced Drain Leakage (GIDL), leading to an increase of a total leakage current.

Figure 8:
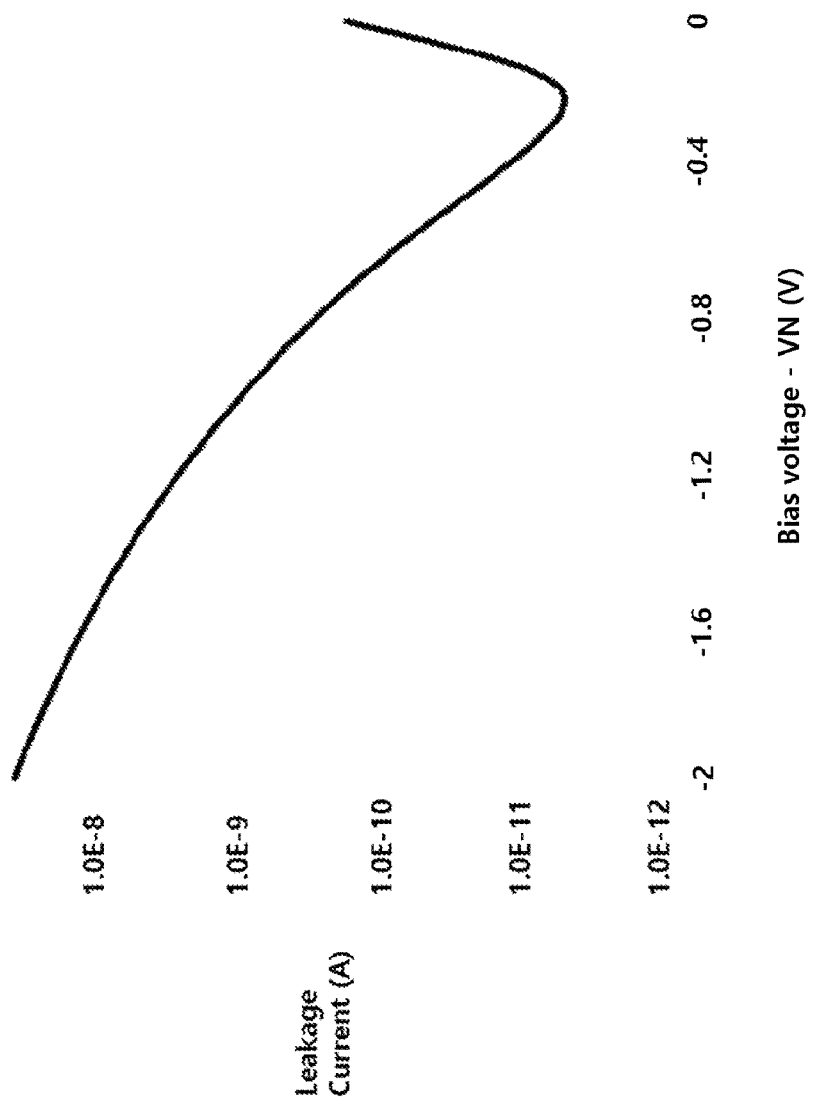
FIG. 8 is a graph illustrating a relation between a bias voltage and a leakage current according to an embodiment.

FIG. 8 is a graph illustrating a relation between a bias voltage and a total leakage current in a transistor fabricated using a 65 nm CMOS process according to an embodiment. In the embodiment of FIG. 8, when the bias voltage VN is about −0.21V, the total leakage current is minimized. Accordingly, in this embodiment, the bias voltage VN provided from the bias controller 400 of FIG. 5 may be set to −0.21V.

So far, the negative bias voltage VN provided from the bias controller 400 of FIG. 5 has been described.

An operation of the bias controller 240 of FIG. 6 is substantially the same as that of the bias controller 400 of FIG. 5 described above with reference to FIGS. 7 and 8, except that the bias controller 240 of FIG. 6 provides a positive bias voltage VP, rather than a negative bias voltage VN.

FIG. 9A is a block diagram of a row decoder 910 for controlling the row selector 200 of FIGS. 5 and 6 according to an embodiment. FIG. 9B is a block diagram of a column decoder 930 for controlling the column selectors 310 and 320 of FIGS. 5 and 6 according to an embodiment. FIG. 9C is a block diagram of a decoder controller 950 for controlling the row decoder 910 of FIG. 9A and the column decoder 930 of FIG. 9B according to an embodiment.

The decoder controller 950 includes a column counter 945 and a row counter 940. The row counter 940 counts a row count signal RCNT in synchronization with a clock signal CLK, and the column counter 945 outputs a column count signal CCNT in synchronization with the row count signal RCNT.

The row decoder 910 decodes the row count signal RCNT and outputs a row select signal ENRi, and the column decoder 930 decodes the column count signal CCNT and outputs a column select signal ENj.

Figure 10:
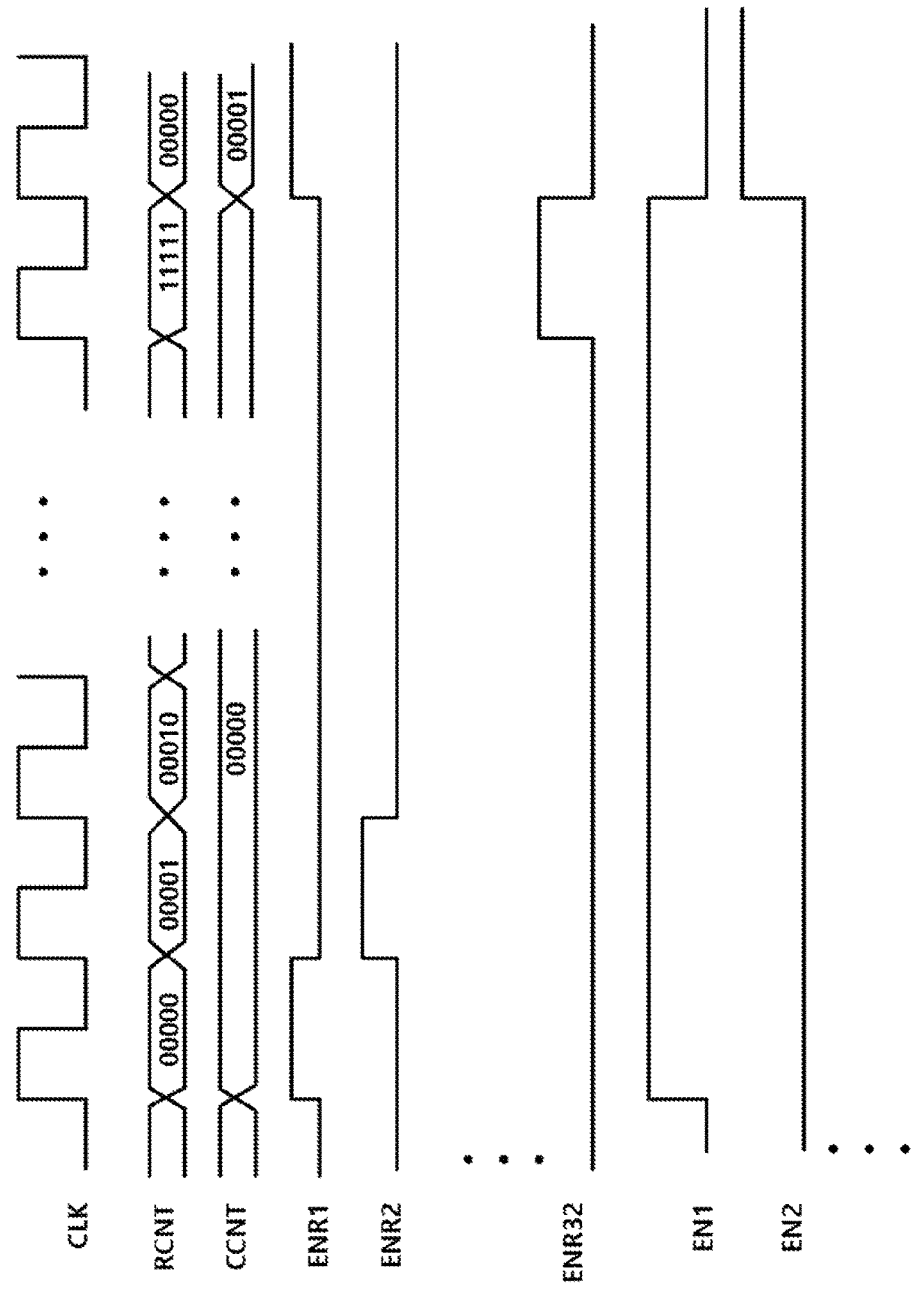
FIG. 10 is a timing diagram illustrating operations of the row decoder, the column decoder, and the decoder controller shown in FIGS. 9A to 9C according to an embodiment.

FIG. 10 is a waveform diagram illustrating operations of the row decoder 910, the column decoder 930, and the decoder controller 950 shown in FIGS. 9A, 9B, and 9C, respectively, according to an embodiment.

The row counter 945 increases a value of the row count signal RCNT in synchronization with the clock signal CLK. In an embodiment, the row counter 945 increases the value of the row count signal RCNT at every time corresponding to a rising edge of the clock signal CLK. The column counter 940 increases a value of the column count signal CCNT when the row count signal RCNT is reset. In an embodiment, the row count signal RCNT is reset when the value of the row count signal RCNT reaches a predetermined value (e.g., '11111' as shown in FIG. 10).

Thus, while the entire rows of a transistor array 100 of FIG. 5 or FIG. 6 are sequentially selected for one selected column, threshold voltages of the transistors included in the selected column are sequentially measured. Then, after the threshold voltages of the transistors included in the selected column have been measured, threshold voltages of transistors included in the next column are measured.

The above-described processes are repeated until the threshold voltages of the entire transistors included in the transistor array 110 are measured.

In accordance with embodiments of the present disclosure, a threshold voltage measuring device can substantially prevent an occurrence of a body effect and accurately measure a threshold voltage of a MOS transistor.

Furthermore, the threshold voltage measuring device can causes a drain-source current having a substantially constant magnitude to flow through the MOS transistor and accurately measure a threshold voltage of the MOS transistor.

Furthermore, the threshold voltage measuring device can rapidly measure the threshold voltages of a plurality of MOS transistors arranged in an array.

Furthermore, the threshold voltage measuring device can reduce a leakage current flowing through one or more of unselected MOS transistors while the threshold voltages of the MOS transistors arranged in the array are measured, thereby accurately measuring the threshold voltages.

The above embodiments of the present disclosure are illustrative and not limitative. Various alternatives and equivalents are possible. Other additions, subtractions, or modifications are obvious in view of the present disclosure and are intended to fall within the scope of the appended claims.

What is claimed is:

1. A threshold voltage measuring device comprising:
   a metal-oxide-semiconductor (MOS) transistor;
   a drain voltage clamping circuit configured to control a drain voltage of the MOS transistor, the drain voltage having a substantially constant level; and
   a constant current supply circuit configured to cause a drain-source current to flow through the MOS transistor, the drain-source current having a substantially constant magnitude.

2. The threshold voltage measuring device of claim 1, wherein a voltage of a source of the MOS transistor has substantially the same level as that of a back gate of the MOS transistor.

3. The threshold voltage measuring device of claim 2, wherein the MOS transistor is an NMOS transistor, and
wherein the source and the back gate of the MOS transistor are coupled to a ground.

4. The threshold voltage measuring device of claim 2, wherein the MOS transistor is a PMOS transistor, and
wherein the source and the back gate of the MOS transistor are coupled to a supply voltage.

5. The threshold voltage measuring device of claim 1, wherein the drain voltage clamping circuit comprises a first amplifier configured to control a gate voltage of the MOS transistor by amplifying a difference between the drain voltage and a set voltage.

6. The threshold voltage measuring device of claim 5, wherein the constant current supply circuit comprises:
a reference current source configured to generate a reference current; and
a current replication circuit configured to replicate the reference current and provide a current that causes the drain-source current to flow through the MOS transistor.

7. The threshold voltage measuring device of claim 6, wherein the current replication circuit comprises:
a regulator configured to regulate a supply voltage according to a feedback voltage and output a rectified voltage;
a first resistor coupled between an output of the regulator and a drain of the MOS transistor;
a second resistor having first and second terminals, the first terminal coupled to the reference current source, a first voltage at the first terminal corresponding to a reference voltage, a second voltage at the second terminal corresponding to the set voltage; and
a second amplifier configured to amplify a difference between the rectified voltage and the reference voltage and provide the feedback voltage to the regulator.

8. The threshold voltage measuring device of claim 6, wherein the reference current has a magnitude that is substantially equal to that of the drain-source current.

9. A threshold voltage measuring device comprising:
a transistor array comprising a plurality of MOS transistors arranged in a matrix, the matrix being defined by a plurality of rows and a plurality of columns;
a row selector configured to apply a gate voltage to a selected row among the plurality of rows according to a row select signal;
a column selector configured to select a column among the plurality of columns according to a column select signal;
a bias controller configured to apply a bias voltage to unselected rows among the plurality of rows;
a drain voltage clamping circuit configured to provide a drain voltage of a MOS transistor selected by the row select signal and the column select signal, the drain voltage having a substantially constant level; and
a constant current supply circuit configured to cause a drain-source current to flow through the selected MOS transistor, the drain-source current having a substantially constant magnitude.

10. The threshold voltage measuring device of claim 9, wherein a voltage of a source and a voltage of a back gate of each of the MOS transistors included in the transistor array have substantially the same level.

11. The threshold voltage measuring device of claim 10, wherein the MOS transistors are NMOS transistors, and
wherein the source and the back gate of each of the NMOS transistors are coupled to a ground.

12. The threshold voltage measuring device of claim 10, wherein the MOS transistors are PMOS transistors, and
wherein the source and the back gate of each of the PMOS transistors are coupled to a supply voltage.

13. The threshold voltage measuring device of claim 9, wherein the drain voltage clamping circuit comprises a first amplifier configured to control the gate voltage by amplifying a difference between a set voltage and the drain voltage of the selected MOS transistor.

14. The threshold voltage measuring device of claim 13, wherein the constant current supply circuit comprises:
a reference current source configured to generate a reference current that has a substantially constant magnitude; and
a current replication circuit configured to copy the reference current and provide a current that causes the drain-source current to flow through the selected MOS transistor.

15. The threshold voltage measuring device of claim 14, wherein the reference current has a magnitude that is substantially equal to that of the drain-source current.

16. The threshold voltage measuring device of claim 14, wherein the current replication circuit comprises:
a regulator configured to regulate a supply voltage according to a feedback voltage and output a rectified voltage;
a first resistor coupled between an output of the regulator and a drain of the selected MOS transistor;
a second resistor having first and second terminals, the first terminal coupled to the reference current source, a first voltage at the first terminal corresponding to a reference voltage, a second voltage at the second terminal corresponding to the set voltage; and
a second amplifier configured to amplify a difference between the rectified voltage and the reference voltage and provide the feedback voltage to the regulator.

17. The threshold voltage measuring device of claim 9, wherein the plurality of MOS transistors comprise N-channel metal-oxide-semiconductor (NMOS) transistors.

18. The threshold voltage measuring device of claim 17, wherein the bias voltage is a negative voltage.

19. The threshold voltage measuring device of claim 9, wherein the plurality of MOS transistors comprise P-channel metal-oxide-semiconductor (PMOS) transistors.

20. The threshold voltage measuring device of claim 19, wherein the bias voltage is a positive voltage.

* * * * *